(12) United States Patent
Dunn

(10) Patent No.: US 8,760,613 B2
(45) Date of Patent: Jun. 24, 2014

(54) MODULAR DISTRIBUTED COMPONENTS FOR LED BACKLIGHT

(75) Inventor: William Dunn, Alpharetta, GA (US)

(73) Assignee: Manufacturing Resources International, Inc., Alpharetta, GA (US)

(*) Notice: Subject to any disclaimer, the term of this patent is extended or adjusted under 35 U.S.C. 154(b) by 337 days.

(21) Appl. No.: 12/915,718

(22) Filed: Oct. 29, 2010

(65) Prior Publication Data

US 2011/0280005 A1 Nov. 17, 2011

Related U.S. Application Data

(63) Continuation-in-part of application No. 12/641,468, filed on Dec. 18, 2009, and a continuation-in-part of application No. 12/905,704, filed on Oct. 15, 2010, and a continuation-in-part of application No. 12/706,652, filed on Feb. 16, 2010, now Pat. No. 8,358,397.

(60) Provisional application No. 61/285,369, filed on Dec. 10, 2009, provisional application No. 61/138,736, filed on Dec. 18, 2008, provisional application No. 61/252,295, filed on Oct. 16, 2009, provisional application No. 61/152,879, filed on Feb. 16, 2009.

(51) Int. Cl.
*G02F 1/1333* (2006.01)
*G09F 13/04* (2006.01)

(52) U.S. Cl.
USPC ............................... 349/161; 362/97.3

(58) Field of Classification Search
USPC ......................... 349/161; 362/97.3
See application file for complete search history.

(56) References Cited

U.S. PATENT DOCUMENTS

| 2007/0139929 A1* | 6/2007 | Yoo et al. ............... 362/294 |
| 2007/0211205 A1* | 9/2007 | Shibata ................. 349/161 |
| 2009/0174840 A1* | 7/2009 | Lee et al. ............... 349/67 |

FOREIGN PATENT DOCUMENTS

| JP | 2004205599 | 7/2004 |
| JP | 2008010361 | 1/2008 |
| JP | 2008112719 | 5/2008 |
| JP | 2009231473 | 10/2009 |

* cited by examiner

*Primary Examiner* — Jerry Blevins
(74) *Attorney, Agent, or Firm* — Standley Law Group LLP

(57) ABSTRACT

A system for powering an LED backlight where power assemblies have electrical communications ran through pass through apertures in a mounting plate and LED backlight panel. A channel may be defined between the mounting plate and the LED backlight panel (or optional thermal plate attached to the rear portion of the LED backlight panel). Sub-channels can be created within the channel which are defined by ribs which connect between the mounting plate and the LED backlight panel (or optional thermal plate attached to the rear portion of the LED backlight panel). Cooling air can be prevented from entering one or more specific sub-channels so that electrical connections can pass through the mounting plate, LED backlight panel, and sub-channel without the risk of cooling air contaminates entering one of the pass through apertures.

13 Claims, 6 Drawing Sheets

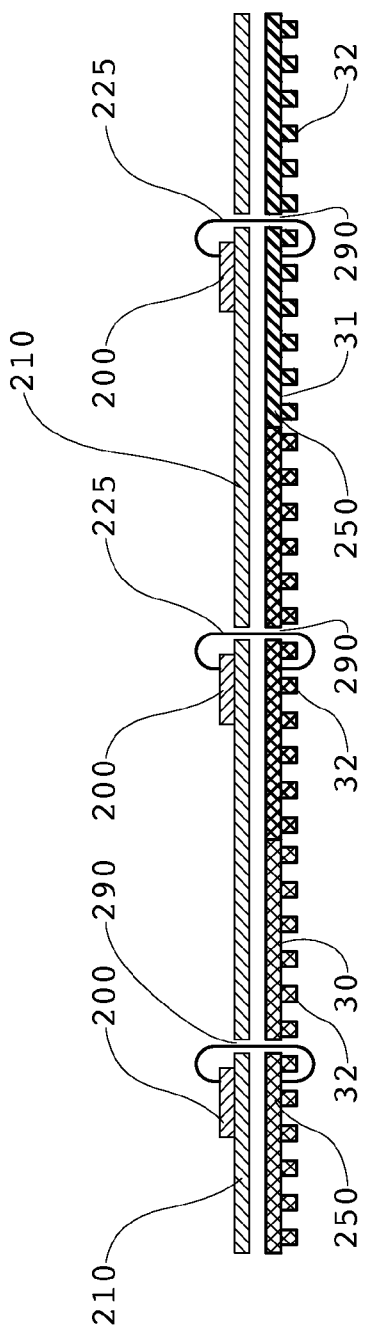
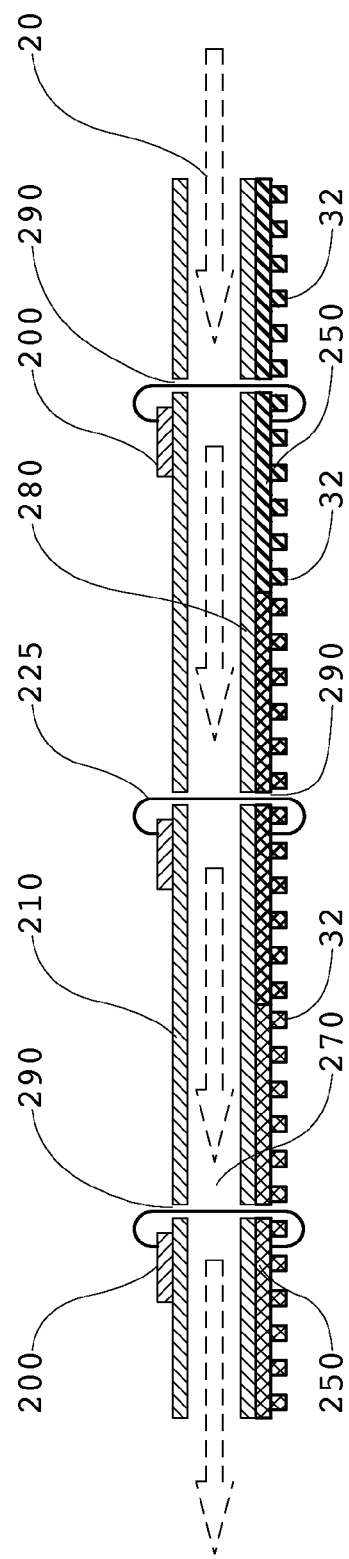

MODULAR DISTRIBUTED COMPONENTS FOR LED BACKLIGHT

CROSS-REFERENCE TO RELATED APPLICATIONS

This application claims priority to U.S. Application Ser. No. 61/285,369 filed on Dec. 10, 2009, herein incorporated by reference in its entirety. This application is a continuation-in-part of U.S. application Ser. No. 12/641,468 filed Dec. 18, 2009, which is a non-provisional of U.S. application Ser, No. 61/138,736 filed Dec. 18, 2008 each of which are herein incorporated by reference in their entirety. This application is a continuation-in-part of U.S. application Ser. No. 12/905,704 filed Oct. 15, 2010, which is a non-provisional of U.S. application Ser. No. 61/252,295 filed Oct. 16, 2009 each of which are herein incorporated by reference in their entirety. This application is a continuation-in-part of U.S. application Ser. No. 12/706,652 filed Feb. 16, 2010, which is a non-provisional of U.S. application Ser. No. 61/152,879 filed Feb. 16, 2009 each of which are herein incorporated by reference in their entirety.

TECHNICAL FIELD

Exemplary embodiments generally relate to electrical systems for LCD backlights.

BACKGROUND OF THE ART

Electronic displays are now being used indoors and outdoors for a variety of different purposes. Some of these displays have also grown substantially in size and are now found in sizes over 55 inches in diagonal. Specifically for liquid crystal displays (LCD), as the backlight increases in size there is also an increase in power that is required to drive the backlight. Also, as the backlight increases in size it generates more heat which, especially in an outdoor environment (sometimes with high ambient temperatures), can become a concern.

FIG. 1 illustrates one of the previous approaches for powering and controlling an LED backlight for a large LCD display. A typical LED backlight may be divided into several sections (panels) where each section (either a single panel or several panels) is powered by its own power circuit. A typical power circuit usually contains several electronic components, including a power module and inductors. Previously, it was thought that power modules and inductors should be grouped separately, with the resulting connections for the LEDs being routed around the edge (perimeter or periphery) of the backlight. Thus, as shown in FIG. 1, several power modules 100 have electrical connections 110 running to a grouping of inductors 150. Electrical connections 160 then travel around the edge of the backlight and connect with each LED panel.

It has been found that the previous method results in a large amount of electrical connectors (wiring) with a substantial amount of assembly time in order to route and connect all of the wiring.

SUMMARY OF THE EXEMPLARY EMBODIMENTS

Exemplary embodiments group the power module and inductors for various sections of the backlight together, resulting in power assemblies. The power assemblies are placed in a relatively close spatial relationship with the sections of the backlight that these components actually correspond with. The electrical connections between the power assemblies and LEDs are preferably passed through a mounting panel and the backlight.

In some embodiments there may be a flow of cooling air which passes immediately behind the backlight. This cooling air may be drawn from the surrounding ambient environment and may contain various contaminates, including dust, pollen, dirt, water vapor, smoke, etc. In these embodiments, the electrical connections may also pass through a sealed channel (or sub-channel) within the path of the cooling air so that there will be little or no contamination of the backlight or rear housing. In other words, the cooling air would preferably not be permitted to enter the cavities which contain the backlight or the power modules, video cards, hard drives, etc.

The foregoing and other features and advantages will be apparent from the following more detailed description of the particular embodiments of the invention, as illustrated in the accompanying drawings.

BRIEF DESCRIPTION OF THE DRAWINGS

A better understanding of an exemplary embodiment will be obtained from a reading of the following detailed description and the accompanying drawings wherein identical reference characters refer to identical parts and in which:

FIG. 2 is a section view of a first embodiment;

FIG. 3 is a section view of a second embodiment;

DETAILED DESCRIPTION

Figure 1:
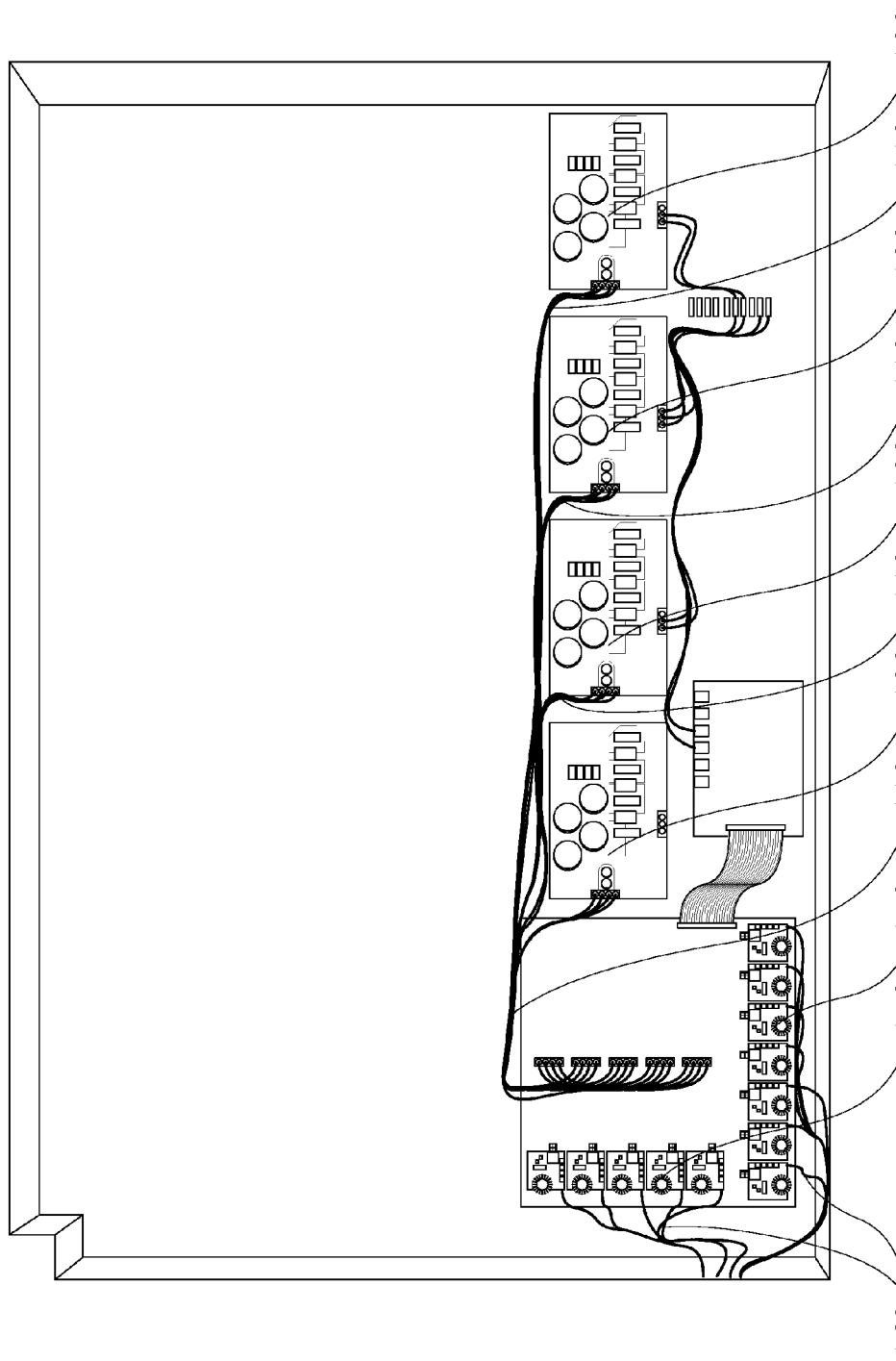
FIG. 1 is a rear view of one of the previous approaches for powering and controlling an LED backlight for a large LCD display.

FIG. 2 provides a sectional view of an exemplary embodiment. Several power assemblies 200 (preferably power modules with the associated inductors) have their electrical connections 225 (ex. conduction lines) passing through a mounting panel 210 and connected to the backlight 250. The backlight 250 in this embodiment includes a plurality of illumination devices 32 which are mounted on a plurality of panels 30 and 31. In an exemplary embodiment, the illumination devices 32 would be LEDs and the panels 30 and 31 would be a PCB and more preferably a metal core PCB. The connection with the backlight 250 may be on the front or rear of the backlight 250.

FIG. 3 provides a sectional view of another embodiment. Again, Several power assemblies 200 (preferably power modules with the associated inductors) have their electrical connections 225 passing through a mounting panel 210 and connected to the backlight 250. In this embodiment, a cooling channel 270 is placed immediately behind the backlight 250. An optional thermally conductive plate 280 may be in thermal communication with the backlight 250 so that heat from the backlight 250 may be transferred to the thermal plate 280. Alternative embodiments may simply allow the cooling air 20 to contact the rear surface of the backlight 250 (without using an additional thermal plate 280). A path of cooling air 20 may be directed along the cooling channel 270 so that heat from the thermal plate 280 (or backlight 250 if thermal plate 280 is not used) may be transferred to the cooling air 20 and removed from the display.

When using the cooling channel 270, the pass through apertures 290 (locations where the electrical connections 225 pass through the mounting panel 210, thermal plate 280, and/or backlight 250) may provide an opportunity for contaminates which are present within the cooling air 20 to enter the display housing or the backlight. This may be undesirable, as it may cause damage to the display components or affect the image quality of the display. Thus, it may be desirable to seal the pass through apertures 290 to ensure that contaminates do not enter the display housing or backlight areas of the display. This may be accomplished by using grommets, which are typically comprised of a soft plastic where they are designed to fit tightly around the electrical connections. Alternatively, or in addition to the grommets, the pass-through points 290 may be sealed with a sealant, for example silicon, glues, or caulk-type material. Still alternatively, a sealed sub-channel can be provided within the main cooling channel 270 which would allow the electrical connections to pass through without the fear of contamination from the cooling air 20. The sealed sub-channel may reduce the assembly time for the display as grommets would not have to be inserted nor would each pass-through point require sealant (although it could be used if desired).

Figure 4:
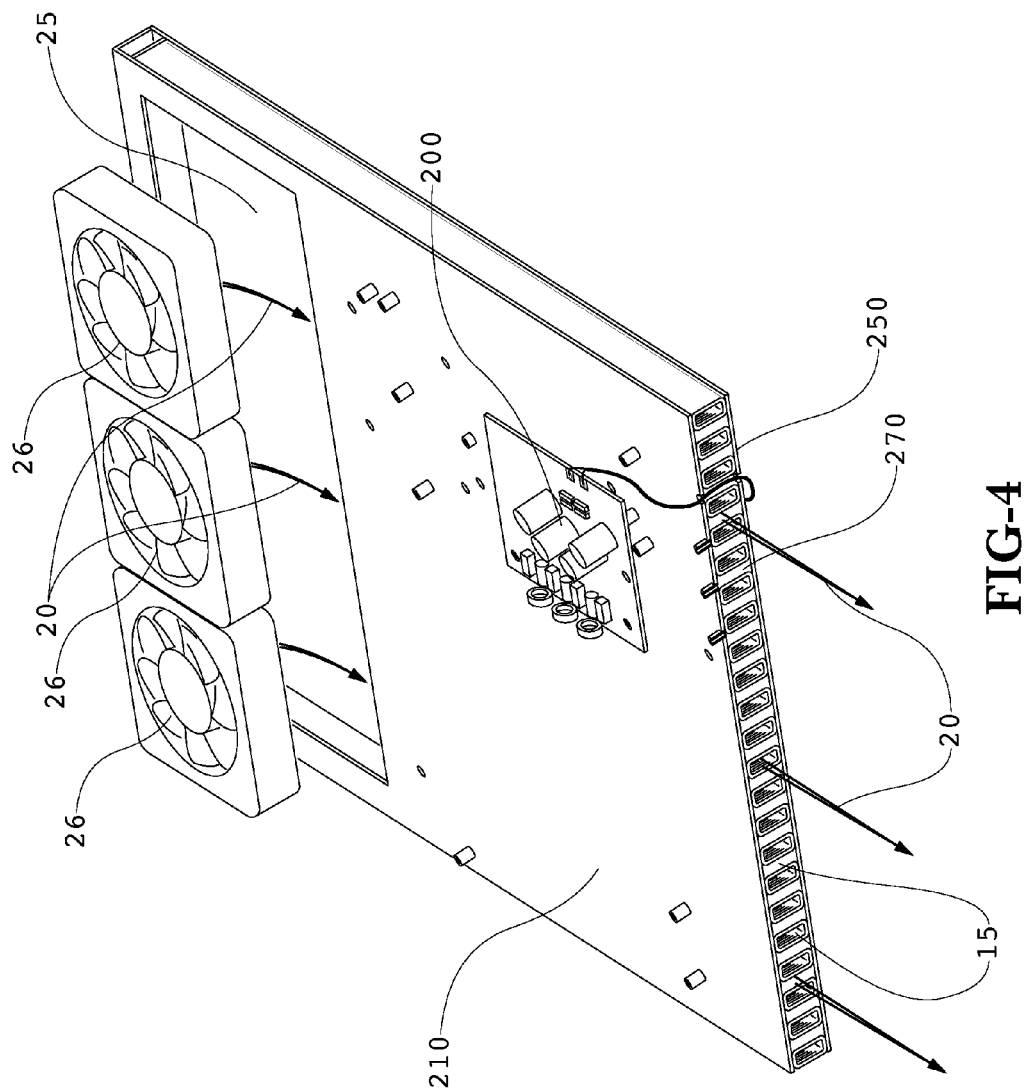
FIG. 4 is a rear perspective section view of an embodiment using a plurality of ribs between the backlight and the panel for mounting the power modules.

FIG. 4 is a rear perspective section view of an embodiment using a plurality of ribs 15 between the backlight 250 and the mounting panel 210. The plurality of ribs 15 may define a number of sub-channels within the main cooling channel 270 defined between the backlight 250 and the mounting panel 210. A power assembly 200 is shown attached to the mounting panel 210. In an exemplary embodiment, the mounting panel 210 would provide a gaseous and contaminate barrier between the side containing the ribs 15 and the side containing the power assembly 200 and any other relatively sensitive electronic components. If the plate 210 provides an adequate barrier, ambient air may be ingested as cooling air 20 and the risk of contaminates entering the side of the plate 210 containing the sensitive electronic components may be reduced or eliminated.

FIG. 4 also provides one example of an inlet aperture 25 which accepts the cooling air 20 and directs it along the ribs 15. One or more fans 26 may be used to draw the air 20 into the inlet aperture 25 and through the ribs 15. In some embodiments, the air 20 may be air conditioned before it is directed along the ribs 15. In some embodiments, the inlet aperture 25 may contain a filter in order to remove any particulate from the air 20. Although shown adjacent to the inlet aperture 25, the fans 26 could alternatively be placed adjacent to an outlet aperture, or adjacent to both the inlet and outlet apertures.

One or more of the sub-channels created by the ribs 15 may be sealed to allow the electrical connections for the power modules to pass through, without risking contamination from the cooling air 20. The ribs 15 shown in this embodiment contain a hollow rectangular cross-section, but this is not required. Other embodiments may contain ribs with I-beam cross-sections, hollow square cross-sections, solid rectangular or solid square cross-sections, 'T' cross-sections, 'Z' cross-sections, a honeycomb cross-section, or any combination or mixture of these. The ribs 15 are preferably thermally conductive and in thermal communication with the backlight 25, but this is not required. In an exemplary embodiment, the ribs 15 would be metallic.

Figure 5:
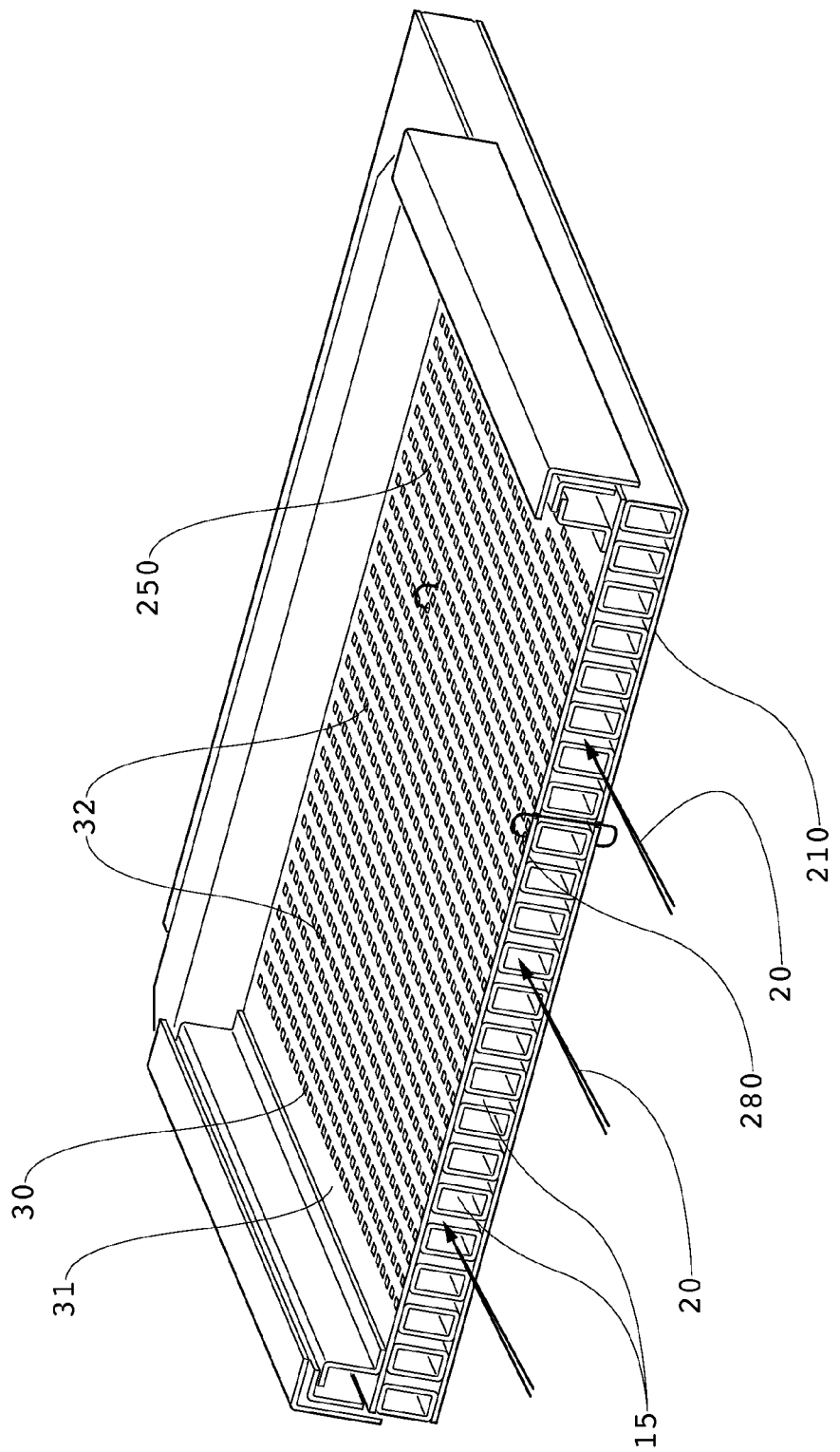
FIG. 5 is a front perspective section view of an embodiment using a plurality of ribs between the backlight and the panel for mounting the power modules.

FIG. 5 is a front perspective section view of an embodiment using a plurality of ribs 15 within the channel defined between the backlight 250 and the mounting panel 210. The backlight 250 in this embodiment includes a plurality of illumination devices 32 which are mounted on a plurality of panels 30 and 31. In an exemplary embodiment, the illumination devices 32 would be LEDs and the panels 30 and 31 would be a PCB and more preferably a metal core PCB. On the surface of the panels 30 and 31 which faces the ribs 15 there may be a thermal plate 280. In an exemplary embodiment, the thermal plate 280 would be metallic and more preferably aluminum. It is preferred that the ribs 15 are in thermal communication with the thermal plate 280. Cooling air 20 may again be forced along the ribs 15 in order to remove heat from the backlight assembly 250. Of course, this could also occur through natural convection.

Figure 6:
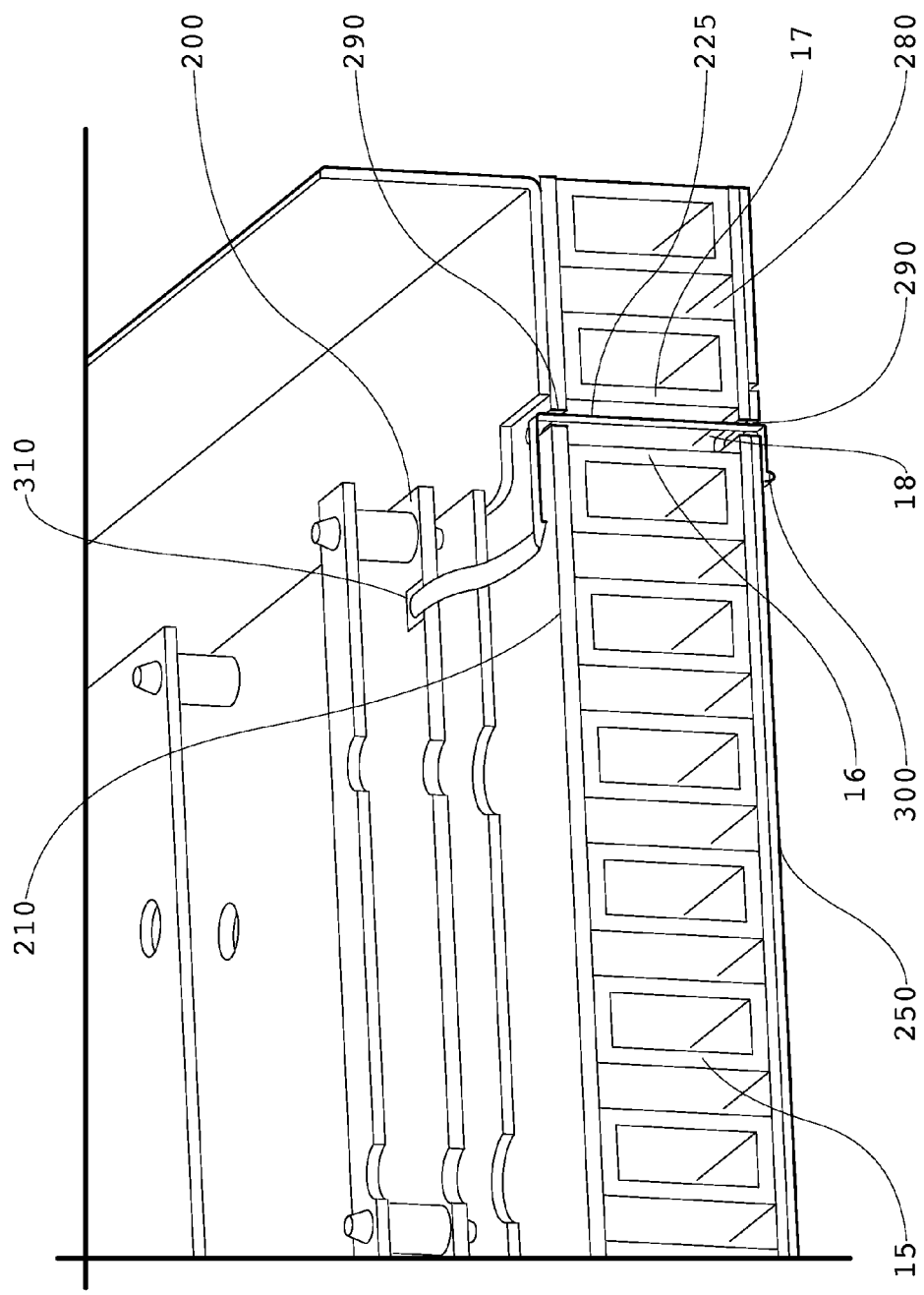
FIG. 6 is a rear perspective section view showing electrical connectors passing through a sub-channel.

FIG. 6 is a section view showing electrical connections 225 passing through a sub-channel 18 which is defined by the space enclosed by the ribs 16 and 17, thermal plate 280, and mounting panel 210. The electrical connections 225 may enter the sub-channel 18 though pass-through apertures 290. The electrical connections 225 may establish electrical communication between the backlight 250 and the power assembly 200. The electrical connections 225 connect with the backlight 250 at connection point 300 while connecting with the power assembly 200 at connection point 310. In this embodiment, the portion of the inlet aperture which is adjacent to sub-channel 18 may be blocked so that cooling air cannot enter the sub-channel 18. This prevents any contaminates which may be present within the cooling air from entering either of the pass-through apertures 290. Thus, as long as the sub-channel 18 is properly sealed from the adjacent sub-channels, blocking the inlet of the channel 18 may reduce the risk of contaminates from the cooling air entering the pass-through points 290 and sensitive portions of the display. The sub-channel 18 may be blocking by using any type of blocking device/method including but not limited to: placing a plug (plastic, rubber, fabric, or any combination) at the entrance of the sub-channel, blocking the entrance with adhesive, blocking the entrance with double-sided tape or adhesive-backed substrate, welding a cover plate to cover the entrance, and attaching a cover plate with mechanical fasteners or adhesives.

Figure 7:
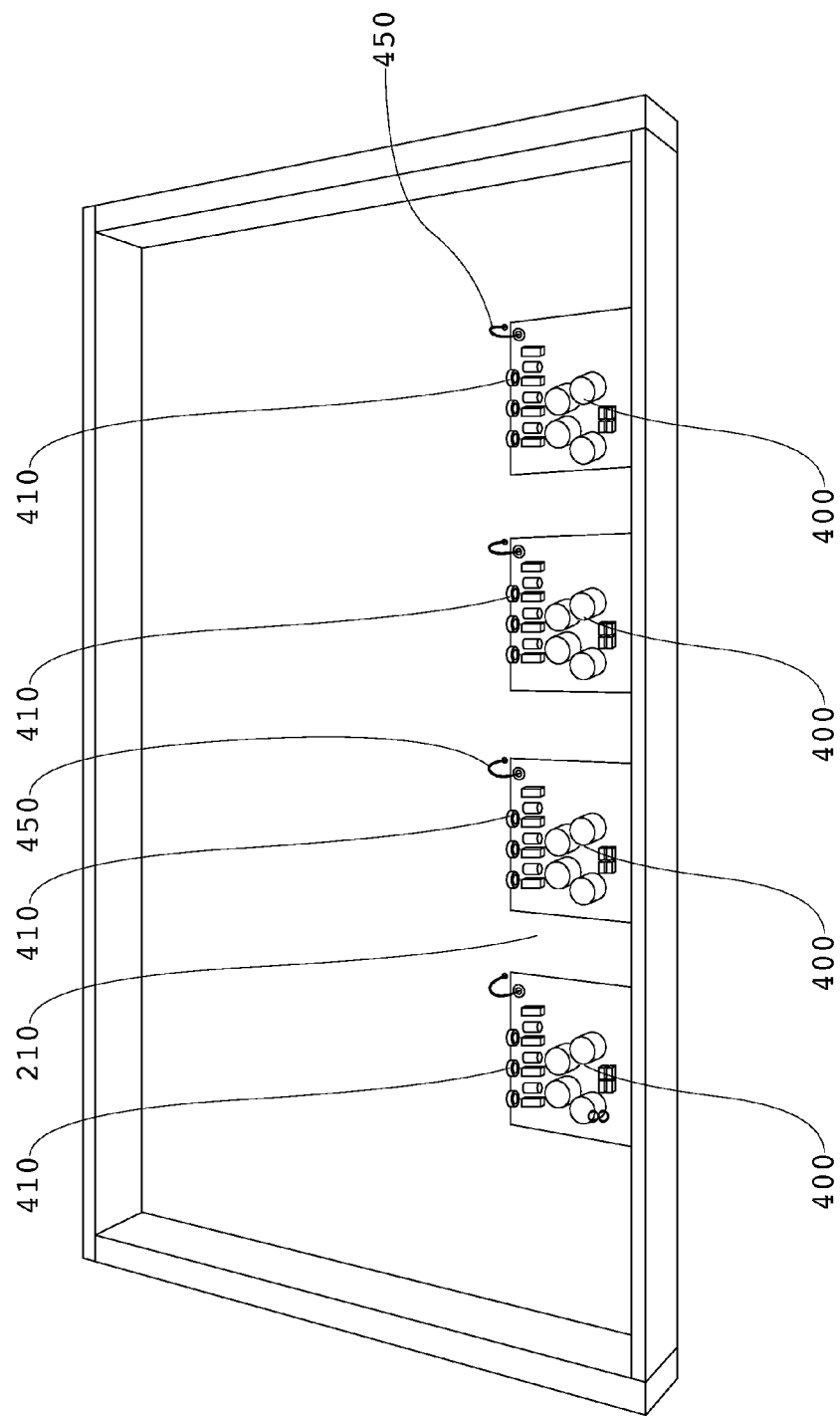
FIG. 7 is a rear view of an exemplary embodiment for powering and controlling an LED backlight.

FIG. 7 is a rear view of an exemplary embodiment for powering and controlling an LED backlight for a large LCD. A plurality of power supplies 400 with the associated inductors 410 (i.e. power assemblies) have electrical connections 450 (ex. conduction lines) passing through a mounting panel 210 and connected to the backlight. The exemplary designs herein allow for a backlight to be connected with power assemblies using only a minimal amount of wiring as well as a minimal amount of assembly time. Furthermore, the exemplary embodiments ensure that a clean, contaminate free environment is maintained between the LED controlling electronics and the LED backlight.

It should be noted that although 4 power assemblies are shown, embodiments may use more or less than 4 power assemblies with any particular arrangement. The size and type of display/backlight may control the actual number of power assemblies used.

Further, it should be noted that the drawings herein are not necessarily drawn to scale. For the sake of simplicity and clarity, some components may be shown enlarged or simplified for explanatory purposes.

Having shown and described preferred embodiments, those skilled in the art will realize that many variations and modifications may be made to affect the described embodiments and still be within the scope of the claimed invention. Additionally, many of the elements indicated above may be altered or replaced by different elements which will provide the same result and fall within the spirit of the claimed invention. It is the intention, therefore, to limit the invention only as indicated by the scope of the claims.

The invention claimed is:

1. A LED backlight system comprising:
a printed circuit board (PCB) having a front and rear side;
a plurality of LEDs on the front side of the PCB;
a mounting plate adjacent to the rear side of the PCB;
an electrical power assembly mounted to the mounting plate;
a first pass through aperture located on the PCB;
a second pass through aperture located on the mounting plate; and
electrical connections between the power assembly and LEDs which pass through the first and second pass through apertures.

2. The LED backlight system of claim 1 further comprising:
a thermally conductive plate attached to the rear side of the PCB; and
a fan positioned to force cooling air over the thermally conductive plate.

3. The LED backlight system of claim 1 further comprising:
a cooling channel defined by the space between the rear side of the PCB and the mounting plate; and
a fan positioned to draw cooling air through the cooling channel.

4. The LED backlight system of claim 3 further comprising:
a sub-channel within the cooling channel and containing the first and second pass through holes and electrical connections.

5. The LED backlight system of claim 4 wherein:
the sub-channel is defined by the rear side of the PCB, mounting plate, and a pair of ribs which connect between the rear side of the PCB and mounting plate.

6. The LED backlight system of claim 4 further comprising:
a blocking device placed within the sub-channel to block cooling air from passing through the sub-channel.

7. The LED backlight system of claim 5 wherein:
the pair of ribs are thermally conductive and in thermal communication with the rear side of the PCB.

8. A LED backlight system comprising:
a plurality of LEDs mounted on a substrate having a front and rear side;
a mounting plate spaced apart from the rear side of the substrate and substantially parallel to the substrate;
a plurality of ribs interposed between the mounting plate and rear side of the substrate and in thermal communication with the substrate;
a fan positioned to draw cooling air between the plate and substrate and along the ribs;
an electrical power assembly mounted to the mounting plate;
a first pass through aperture located on the substrate;
a second pass through aperture located on the mounting plate; and
electrical connections between the power assembly and LEDs which pass through the first and second pass through apertures.

9. The LED backlight system of claim 8 wherein:
the substrate is a metal core printed circuit board.

10. The LED backlight system of claim 8 wherein:
the ribs are metallic.

11. The LED backlight system of claim 8 further comprising:
one rib which contains a hollow cross-section that is aligned with the first and second pass through apertures so that the electrical connections may pass through the hollow cross-section of the rib.

12. The LED backlight system of claim 8 wherein:
the first and second apertures are located between a pair of ribs.

13. The LED backlight system of claim 12 further comprising:
a blocking device placed between the pair of ribs which contain the first and second apertures to prevent cooling air from passing through.

* * * * *